United States Patent
Seki

(10) Patent No.: US 7,707,476 B2
(45) Date of Patent: *Apr. 27, 2010

(54) DECODER DEVICE AND DECODING METHOD AND PROGRAM

(75) Inventor: Katsutoshi Seki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 972 days.

This patent is subject to a terminal disclaimer.

(21) Appl. No.: 11/476,686

(22) Filed: Jun. 29, 2006

(65) Prior Publication Data

US 2007/0033482 A1    Feb. 8, 2007

(30) Foreign Application Priority Data

Jun. 30, 2005    (JP)    ............... 2005-191152

(51) Int. Cl.
    *H03M 13/00*    (2006.01)
(52) U.S. Cl. ................ 714/755; 714/786
(58) Field of Classification Search ........ 714/755, 714/786
    See application file for complete search history.

(56) References Cited

U.S. PATENT DOCUMENTS

| | | | |
|---|---|---|---|
| 7,178,081 B2 * | 2/2007 | Lee et al. ............... | 714/752 |
| 7,246,304 B2 * | 7/2007 | Kim ........................ | 714/801 |
| 7,325,174 B2 * | 1/2008 | Choi et al. ............. | 714/704 |
| 7,401,283 B2 * | 7/2008 | Shen et al. ............. | 714/758 |
| 2004/0185886 A1 | 9/2004 | Matsumoto | |
| 2005/0138516 A1 * | 6/2005 | Yedidia ................... | 714/746 |
| 2007/0113163 A1 * | 5/2007 | Golitschek Edler Von Elbwart et al. ............ | 714/801 |

FOREIGN PATENT DOCUMENTS

JP    2003-244109    8/2003

OTHER PUBLICATIONS

Mackay, "Good Error-Correcting Codes Based on Very Sparse Matrices," IEEE Transactions on Information Theory, vol. 45, No. 2, Mar. 1999, pp. 399-431.
Yeo et al., "High Throughput Low-Density Parity-Check Decoder Architectures," IEEE, 2001, pp. 3019-3024.

* cited by examiner

*Primary Examiner*—Guy J Lamarre
(74) *Attorney, Agent, or Firm*—Foley & Lardner LLP

(57) ABSTRACT

A device and a method that improve decoding characteristics of an LDPC decoder to which SPA where the equation for the computation of messages is approximated and the number of messages are reduced is applied. A received LDPC code is decoded by repeating the passing of messages between a plurality of check nodes and a plurality of bit nodes corresponding to a check matrix, and messages sent from one of the check nodes to one of the bit nodes out of messages sent from the one of bit nodes to the one of check nodes are weighted at the one of bit nodes so that the longer ago the messages are computed at the one of check nodes, the less influential they become.

20 Claims, 7 Drawing Sheets

DECODER DEVICE AND DECODING METHOD AND PROGRAM

FIELD OF THE INVENTION

The present invention relates to a decoding technology and to a device, a method, and a program suitable for decoding Low Density Parity Check Codes (LDPC hereinafter).

BACKGROUND OF THE INVENTION

In recent years, error correction technology has been widely used in wireless, cable, and recording systems. The combination of Low Density Parity Check Codes (LDPC) and its decoding method, the Sum-Product Algorithm (SPA hereinafter) has very good decoding characteristics and is expected to be an excellent error correction code for the next generation. At the sending side, an encoder generates a check matrix H, which is later described, and a generator matrix G (k×n matrix; k: Information length, n: code word length) is derived ($GH^T=0$ (T denotes transposition matrix). The encoder then receives a message $(m_1, m_2 \ldots, m_k)$ of an information length k, generates a code word $(c_1, c_2, \ldots, c_n)$ from $(m_1, m_2, \ldots, m_k)$ G using the generator matrix G (where $(c_1, c_2, \ldots, c_n)H^T=0$), and modulates and sends the generated code word. A decoder receives the modulated signal via a channel and demodulates it. The decoder then subjects the demodulated result to an iterative decoding by SPA and provides an estimated result (corresponding to the original $(m_1, m_2, \ldots, m_k)$). (Refer to Patent Document 1.) The gist of LDPC code and SPA decoding will be described.

LDPC code is a linear code defined by a sparse check matrix. The check matrix of an LDPC code can be expressed by a bipartite graph called the Turner graph. Let's assume that a check matrix H, which is an M×N matrix, is given. Nodes that constitute the Turner graph are constituted by N bit nodes and M check nodes. The bit nodes and the check nodes correspond to the column and row of the check matrix H respectively, and when the elements in row i and column j of the check matrix are 1, the $j^{th}$ bit node and the $i^{th}$ check node are connected.

For instance, when a check matrix H is as given by an equation (1), the Turner graph is as shown in FIG. 4.

$$H = \begin{bmatrix} 1111000000 \\ 1000111000 \\ 1000000111 \end{bmatrix} \quad (1)$$

Each bit node represents the received bit (each symbol of the code word) and each check node represents a parity check constraint (condition) among the bit nodes (the symbols) to which it is connected. In the aforementioned check matrix H, for a message of code word length 10 $(m_1, \ldots, m_{10})$, a check node 1 corresponds to $m_1+m_2+m_3+m_4=0$, a check node 2 to $m_1+m_5+m_6+m_7=0$, and a check node 3 to $m_1+m_8+m_9+m_{10}=0$ as a parity check condition.

In SPA, decoding is performed by sending/receiving a message over a Turner graph constituted by a check matrix defining an LDPC code. A round of message passing between connected bit node and check node is called one iteration.

In order to obtain good decoding characteristics, multiple iterations are needed. A message $Q_{nm}$ from a bit node n to a check node m out of messages that are passed between the nodes is given by an equation (2). Further, a message $R_{mn}$ from the check node m to the bit node n is given by an equation (3). Note that an estimate is provided according to a calculation result code of the message $Q_{nm}$ at the bit node after multiple iterations (depending on whether the code is positive or negative, 0 or 1).

$$Q_{nm} = \ln\left[\frac{p_n(1)}{p_n(0)}\right] + \left(\sum_{m' \in \mu(n)} R_{m'n}\right) - R_{mn} \quad (2)$$

Note that $\mu(n)$ of m'∈$\mu(n)$ in $(\Sigma R_{m'n})$, the summing operation of $R_{m'n}$ about m', in the equation (2) represents a set of check nodes adjacent to the bit node n. In other words, it is a set of row numbers obtaining 1 in an $n^{th}$ column of the check matrix H, and in the case of the check matrix H of the equation (1), $\mu(1)=\{1,2,3\}$, and $\mu(2)=\{1\}$.

Further, in the equation (2), $\ln[p_n(1)/p_n(0)]$ is an input LLR (Log Likelihood Ratio). Note that $\ln[pn(1)/pn(0)]$ represents the same thing as $(\ln[P(yn|xn=0)/P(yn|xn=1)])$, which is described later.

$$R_{mn} = \Phi^{-1}\left\{\Phi\left(\sum_{n' \in v(m)} Q_{n'm}\right) - \Phi(Q_{nm})\right\} * \quad (3)$$

$$\left(\text{sign}(Q_{nm}) * \prod_{n' \in v(m)} \text{sign}(Q_{n'm})\right) \text{ where:}$$

$$\Phi(x) = -\log\left(\tanh\left(\frac{1}{2}x\right)\right) \quad (4)$$

$(\Sigma Q_{n'm})$, the summing operation of $Q_{n'm}$ about n', and v(m) of n'∈v(m) in $\Pi\text{sign}(Q_{n'm})$, the product operation of sign $(Q_{n'm})$, in the equation (3) represent a set of bit nodes adjacent (connected) to the check node m. In other words, it is a set of column numbers obtaining 1 in an $m^{th}$ row of the check matrix H of the equation (1), and in the case of the check matrix H of the equation (1), $v(1)=\{1,2,3,4\}$.

When an LDPC decoder is realized, check node are conventionally divided into a plurality of groups and message computations are pipeline-processed. This group division is called "clustering" and the order of computation is called "scheduling."

FIG. 5 is a drawing showing how messages are passed when the LDPC code defined by the equation (1) is decoded in cluster size 1 (1 check node per 1 cluster). In FIG. 5, how messages are passed between the bit nodes and the check nodes in the case of the Turner graph shown in FIG. 4 (cluster size 1) is shown. In FIG. 5, the bit nodes are indicated by the circled numbers (indicating each bit node number), the check nodes by the boxed numbers (indicating each check node number), and the arrows from the nodes indicate the passing of messages as in FIG. 4.

Messages $Q_{11}, Q_{21}, Q_{31}$, and $Q_{41}$ are sent from bit nodes 1, 2, 3, 4 to the check node 1, and the check node 1 sends messages $R_{11}, R_{12}, R_{13}$, and $R_{14}$ to the bit nodes 1, 2, 3, and 4 respectively. Next, messages $Q_{12}, Q_{52}, Q_{62}$, and $Q_{72}$ are sent from the bit nodes 1, 5, 6, and 7 to the check node 2, and the check node 2 sends messages $R_{21}, R_{25}, R_{26}$, and $R_{27}$ to the bit nodes 1, 5, 6, and 7 respectively. Then, messages $Q_{13}, Q_{83}, Q_{93}$, and $Q_{103}$ are sent from the bit nodes 1, 8, 9, and 10 to the check node 3, and the check node 3 sends messages $R_{31}, R_{38}, R_{39}$, and $R_{310}$ to the bit nodes 1, 8, 9, and 10 respectively. The sequence of message passing described above constitutes one iteration.

The Turner graph in FIG. 4 does not include a loop. Here, loop means a circulating path that starts from a node.

When a Turner graph does not include any loop, SPA can compute an accurate posterior probability.

On the other hand, a Turner graph defined by a check matrix H of an equation (5) includes a loop of length 4 as shown in FIG. 6. In FIG. 6, arrows indicate the direction of each message between nodes.

$$H = \begin{bmatrix} 111000 \\ 011100 \\ 000111 \end{bmatrix} \quad (5)$$

In other words, as shown in FIG. 6, the path of the loop of length 4 is from a check node 1 to a bit node 3, from the bit node 3 to a check node 2, from the check node 2 to a bit node 2, and from the bit node 2 to the check node 1.

When a message goes around like this, an accurate posterior probability cannot be computed by the decoder, resulting in deteriorated decoding characteristics. It is known that the shorter the loop is, the worse decoding characteristics become (Non-Patent Document 1).

When an LDPC decoder is realized, a majority of the chip area is occupied by a register or memory for holding messages and interconnect paths for sending/receiving messages.

Accordingly, a method for reducing the number of messages by approximating the equation (2) by an equation (6) is proposed (Non-Patent Document 2).

$$Q'_n(k) = Q'_n(k-1) + \sum_{m' \in \{S(k) \cap \mu(n)\}} R_{m'n} \quad (6)$$

In the equation (6), $R_{mn}$ refers to messages from a check node m to a bit node n and can be given by the equation (3).

Further, S(k) of m'∈{S(k)∩μ(n)} in (ΣR$_{m'n}$), the summing operation of R$_{m'n}$ about m', is a set of check nodes included in the cluster being computed at a time k, μ(n) is a set of check nodes adjacent to the bit node n, and ∩ represents AND. Therefore, in the summing operation of R$_{m'n}$ about m', the messages R$_{m'n}$ from a check node m' that is included in both S(k) and μ(n) are summed, Q'$_n$ (k−1) at a previous time k−1 is added to the summed result, and Q'$_n$(k), the message at the time k, is the result of this addition. The bit node n passes the same message Q'$_n$(k) to the check node connected to the bit node n.

In the message computation process at the bit nodes, the messages R$_{mn}$ from the check node m to the bit node n are computed for each cluster, and the computation results are added to Q'$_n$.

The initial value Q'$_n$(0) of Q'$_n$(k) is the input (channel) LLR. LLR stands for Log Likelihood Ratio ($\ln[P(y_n|x_n=0)/P(y_n|x_n=1)]$). Note that $y_I$ is the received symbol, $x_I$ is the transmitted symbol, $n_I$ is an additive white Gaussian channel for white Gaussian noise ($y_i=x_i+n_i$), and binary-bipolar conversion (0→+1, 1→−1) is executed.

As a result of having the equation (6) approximate the equation (2), one bit node sends the same message to all the adjacent check nodes (all the check nodes connected to the bit node). Therefore, resources such as registers for holding messages and interconnect paths can be greatly reduced.

Further, as a result of having the equation (6) approximate the equation (2), the amount of the message computations can be reduced by 50 percent or more, compared to the equation (2). In other words, the computation speed and processing performance are improved.

[Patent Document 1]
Japanese Patent Kokai Publication No. JP-P2003-244109A
[Non-Patent Document 1]
D. J. C. MacKay, "Good error-correcting codes based on very sparse matrices," IEEE Transactions on Information Theory, vol. 45, pp 399-431 (1999)
[Non-Patent Document 2]
Yeo, E.; Pakzad, P.; Nikolic, B.; Anantharam, V., "High throughput low-density parity-check decoder architectures," Global Telecommunications Conference 2001, Volume: 5, 25-29 November 2001, pp 3019-3024

SUMMARY OF THE DISCLOSURE

As mentioned above, by having the equation (6) approximate the equation (2), the amount of the message computations is greatly reduced, compared with the equation (2). However, there are problems as described below. The investigation of these problems is a result of research performed by the present inventor.

In the approximation by the equation (6), the messages R$_{mn}$ that the check node m sends to the bit node n are sent back to the check node m even when no loop exists in the Turner graph. In this case, as in a situation in which a short loop exists, a posterior probability cannot be computed accurately, resulting in the deterioration of the error correction performance.

For instance, in the case of the Turner graph in FIG. 4, in the computation of Q$_{nm}$ in the equation (2), μ(1)={1, 2, 3}. The summing operation of ΣR$_{m'n}$ in the computation of a message Q$_{11}$ from the bit node 1 to the check node 1 is performed on m'∈μ(1), therefore ΣR$_{m'n}$=R$_{11}$+R$_{21}$+R$_{31}$. R$_{11}$ is subtracted from the total sum (R$_{11}$+R$_{21}$+R$_{31}$) in the equation (2), therefore resulting in R$_{21}$+R$_{31}$.

On the other hand, in the case of the approximation by the equation (6), the summing operation of ΣR$_{m'n}$ where Q'$_1$(k) is R$_{11}$+R$_{21}$+R$_{31}$, and Q'$_n$(k) is sent from the bit node 1 to the check nodes 1, 2, and 3. R$_{11}$ is included in the message received by the check node 1 and it is essentially equivalent to the case where a short loop exists.

FIGS. 7A and 7B are drawings illustrating the operation timing of message computation. FIG. 7A is a drawing illustrating the timing operation when there is no delay in the message computation at the check nodes, and FIG. 7B is a drawing illustrating the timing operation when there is a processing delay of 2 clock cycles in the message computation at the check nodes.

In FIGS. 7A and 7B, input message is the input message from the bit nodes to each check node in FIGS. 4 and 5. Computation clusters C1, C2, and C3 represent a first, second, and third clusters, and output message represents the message outputted by the corresponding cluster. Note that, in FIGS. 4, 5, 7A and 7B, one cluster equals one check node. The check node 1 is grouped as the first cluster (C1), the check node 2 as the second cluster (C2), and the check node 3 as the third cluster (C3). In other words, the first, second, and third clusters are the check nodes 1, 2, and 3 respectively in FIGS. 4, 5, and 7. "RCYX" in the drawing represents the output of an X$^{th}$ cluster at a Y$^{th}$ iteration. "L" in the input message is the value of the input LLR.

When the approximation by the equation (6) is employed, a message sent by a check node is passed back to the original check node even if no loop exists in the Turner graph. For instance, an output RC11 of the first cluster C1 at a first iteration (the output of the first cluster at the first iteration and its content is a message R$_{11}$ from the check node 1 to the bit node 1) is passed back to the first cluster C1 (the check node 1) at the ensuing second iteration (refer to FIGS. 7A and 7B).

As a result, even when no loop exists in the Turner graph, a posterior probability cannot be computed accurately and the error correction performance deteriorates as in a situation in which a short loop exists in the graph.

When there is a delay in the message computation at a check node, the error correction performance deteriorates greatly. This is because the ratio of a message or messages outputted by a check node within the entire input messages that the same check node receives increases.

For instance, when there is no delay in the message computation at the check nodes, the input messages that the first cluster receives at the second iteration are L+RC11+RC12+RC13 (refer to FIG. 7A). Here, L is the value of the input LLR. On the other hand, when there is a delay of 2 clock cycles in the message computation at the check nodes, it is L+RC11 in the second iteration (refer to FIG. 7B), increasing the ratio (proportion) of RC11, i.e., the output message of the first cluster C1. Because of this, the error correction performance and decoding characteristics will deteriorate.

In order to solve the above-described problems, the invention disclosed in the present application is structured as below.

According to an aspect of the present invention, there is provided a decoding device that decodes a received low density parity check code by repeating the passing of messages between a plurality of check nodes and a plurality of bit nodes corresponding to a low density parity check matrix, and a message or messages sent from one of the check nodes to one of the bit nodes out of the message or messages sent from the one of bit nodes to the check nodes is/are weighted.

In the present invention, it is controlled so that a bit node passes the same message (or messages) to all check nodes connected to the same bit node and that the ratio of messages outputted by the check nodes within messages sent to the check node is reduced (smaller).

In the present invention, the longer ago message/messages is/are computed at the check node, the less influential they become.

In the present invention, the bit node may comprise a holding that holds messages received from the check nodes; and multiplies the held message by a weight of a positive number smaller than 1 every time the bit nodes receive messages from the check node thereafter; and holds the multiplication result.

In the present invention, when the bit node receives a message for the $i^{th}$ time (where i is a positive number not less than 2) from the check node, it may compute a message to be sent to the check node based on the multiplication of a message received from the check node for the $j^{th}$ time (where j is an integer greater than or equal to 1, but less than i) by $w^{(i-j)}$ (where w is the weighted coefficient) and the message received for the $i^{th}$ time (where i is a positive number not less than 2).

According to another aspect of the present invention, there is provided a decoding method. The method comprises:

a step of having a process for decoding a received low density parity check code by repeating the passing of messages between a plurality of check nodes and a plurality of bit nodes corresponding to a low density parity check matrix; and a step of weighting at least one message sent from one of the check nodes to one of the bit nodes out of at least one message sent from the one of bit nodes to the one of check nodes.

According to a further aspect of the present invention, there is provided a computer program comprising:

decoding a received low density parity check code by repeating the passing of a message or messages between a plurality of check nodes and a plurality of bit nodes corresponding to a low density parity check matrix; and weighting the message or messages sent from one of the check nodes to one of the bit nodes out of a message or messages sent from the one of bit nodes to the one of check nodes. The program is stored in a machine-readable medium by a computer.

The meritorious effects of the present invention are summarized as follows.

According to the present invention, in an LDPC decoder to which SPA that reduces the number of messages by approximating the equation for the computation of messages is applied, the decoding characteristics are improved by weighting a message so that the longer ago the message is computed, the less influential it becomes.

BRIEF DESCRIPTIONS OF THE DRAWINGS

PREFERRED EMBODIMENTS OF THE INVENTION

Figure 1:
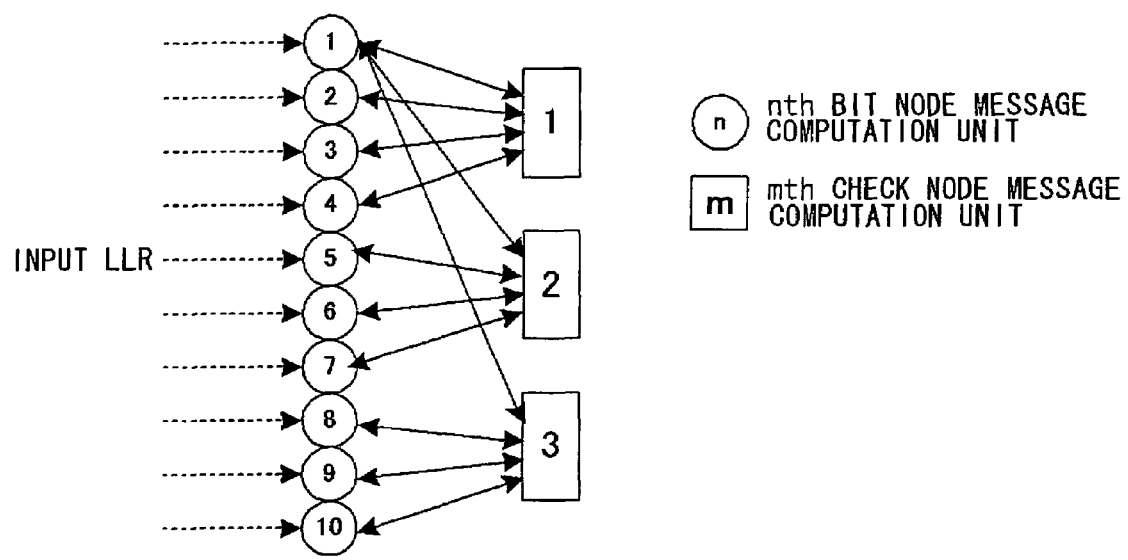
FIG. 1 is a drawing for explaining an embodiment of the present invention.

The aforementioned present invention will be further described in detail with reference to the attached drawings. According to the present invention, in a decoder device that decodes a received LDPC code by repeating the passing of messages (reliability information) between a plurality of check nodes and a plurality of bit nodes corresponding to a check matrix H, message computation is approximated, one bit node n is controlled so that it passes the same message $Q_n$ to all check nodes connected to the bit node n, and the ratio of a message $R_{mn}$, which has been outputted by a check node m, within the message $Q_n$ passed from the bit node n to the check node m is controlled to be smaller (reduced).

In an embodiment of the present invention, the message $R_{mn}$ is weighted so that the longer ago the message computation at the check node is performed, the less influential the message $R_{mn}$, which has been outputted by the check node m, becomes within the message $Q_n$ supplied to the check node m from the bit node n. The present invention will be described with reference to an embodiment hereinafter.

Embodiment

In an embodiment of the present invention, the computation of messages from a bit node to a check node is basically performed using the approximation by the equation (6), and a bit node outputs the same message $Q'_n(k)$ (where k is discrete time) to all the check nodes connected to the bit node. The equation (3) is used for the computation of the message $R_{mn}$ from the check node m to the bit node n.

As described above, the deterioration of decoding characteristics accompanies the approximation by the equation (6).

In the present embodiment, decoding characteristics are improved by weighting a message (or messages) supplied by a check node so that the longer ago message computation at the check node is performed, the less influential the message (or messages), which has been supplied by the same check node, becomes within the message sent to the same check node.

In the present embodiment, the approximation equation (6) for the computation of messages from the bit node to the check node is changed to equations (7) and (8).

$$Q'_n(k) = LLR + QS_n(k) \quad (7)$$

$$QS_n(k) = QS_n(k-1)*w + \sum_{m' \in \mu(n)} R_{m'n} \quad (8)$$

Note that w denotes the weighted coefficient (a positive number smaller than 1).

The bit node n holds LLR and a property (or status quantity) $QS_n(k)$ at a time k, and sends $Q'_n(k)$, the result of adding them, to all the adjacent check nodes (refer to the equation (7)). $QSn(0)$, the initial values of $QS_n(k)$, is 0. The property $QS_n(k)$ is updated by adding the total sum ($\Sigma R_{m'n}$) of the messages $R_{m'n}$ received this time to the multiplication of $QS_n(k-1)$ at the previous time (a time k-1) by a weight w ($QS_n(k-1)*w$). (Refer to the equation (8)).

By this weighting process, the longer ago the message is computed, the less influential it becomes. Therefore, compared to the case in which the approximation equation (6) is used, the ratio of the message outputted by a check node within messages supplied to the same check node is reduced, improving the error correction performance.

The embodiment of the present invention will be described using the LDPC code defined by the 10×3 check matrix H of the equation (1).

FIG. 1 is a drawing for explaining the present embodiment. Corresponding to the 10×3 check matrix H of the equation (1), it comprises ten bit nodes (first to tenth bit node message computation units) and three check nodes (first to third check node message computation units). Inputs LLR (Log Likelihood Ratio) supplied to the first to tenth bit node message computation units are channels LLR.

The messages $R_{mn}$ from the check node m to the bit node n are computed for each cluster, and the results are added to $Q'_n$. By this approximation, one bit node sends the same message to all the adjacent check nodes, greatly reducing registers for holding messages and interconnect paths.

At an $n^{th}$ bit node message computation unit (n is any number from 1 to 10), the equations (7) and (8) are used for the computation of messages from the bit node n to a check node.

An $m^{th}$ check node message computation unit (m is any number from 1 to 3) computes the message $R_{mn}$ from the check node m to the bit node n according to the equation (3).

Figure 2:
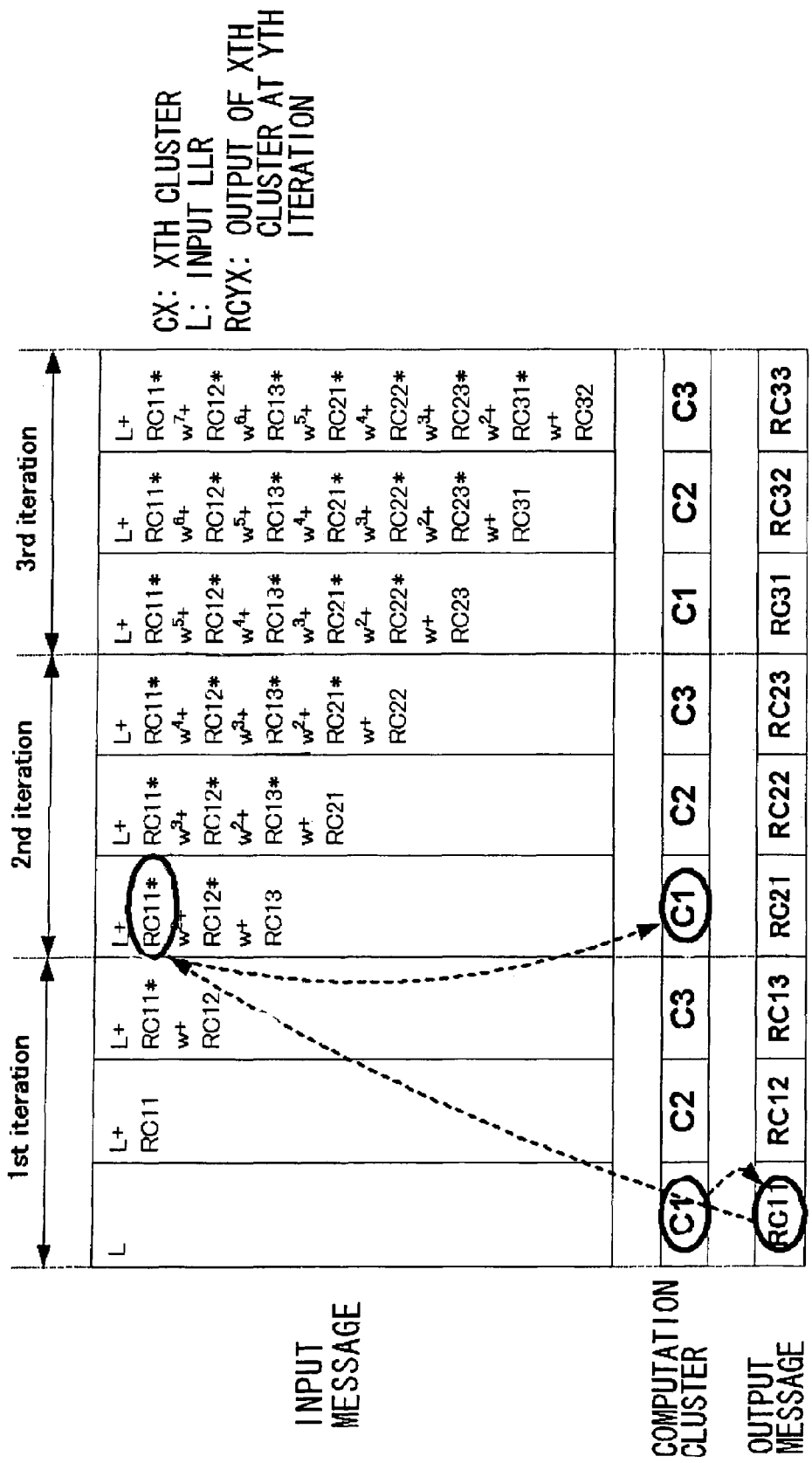
FIG. 2 is a drawing for explaining the operation of the embodiment of the present invention.

FIG. 2 is a drawing illustrating the operation timing when the cluster size is set to 1 in FIG. 1 (one check node per cluster) and the three check nodes are divided into three clusters C1, C2 and C3. Note that FIG. 2 shows the operation timing of messages when there is no delay in the message computation processing at the check nodes. In FIG. 2, the input message relates to the input message from the bit node 1 in FIG. 1 to each check node; computation cluster C1, C2, and C3 represent first, second, and third clusters; and the output message relates to the message outputted by the corresponding cluster (the check node). In FIG. 2, L is the value of the input LLR.

In the present embodiment, at a second iteration, messages supplied to the check node 1 grouped as the cluster C1 are L+RC11*$w^2$+RC12*w+RC13 according to the equations (7) and (8). Since the weighted coefficient w is smaller than 1, by multiplying the message RC11 by the square of w, the ratio of the message RC11 sent from the check node 1, which is grouped as the cluster C1, to the bit node 1 within messages supplied by the bit node 1 to the check node 1 grouped as the cluster C1 is reduced. Therefore, decoding characteristics can be improved while using the approximation by the equation (6).

Further, as evident in FIG. 2, every time a message is supplied from the check node, for instance, the message RC11, which has been already computed, is multiplied by the weighted coefficient w exponentially in order. As a result, the longer ago a message is computed, the less influential it becomes within a message sent from the bit node to the check node.

Figure 3:
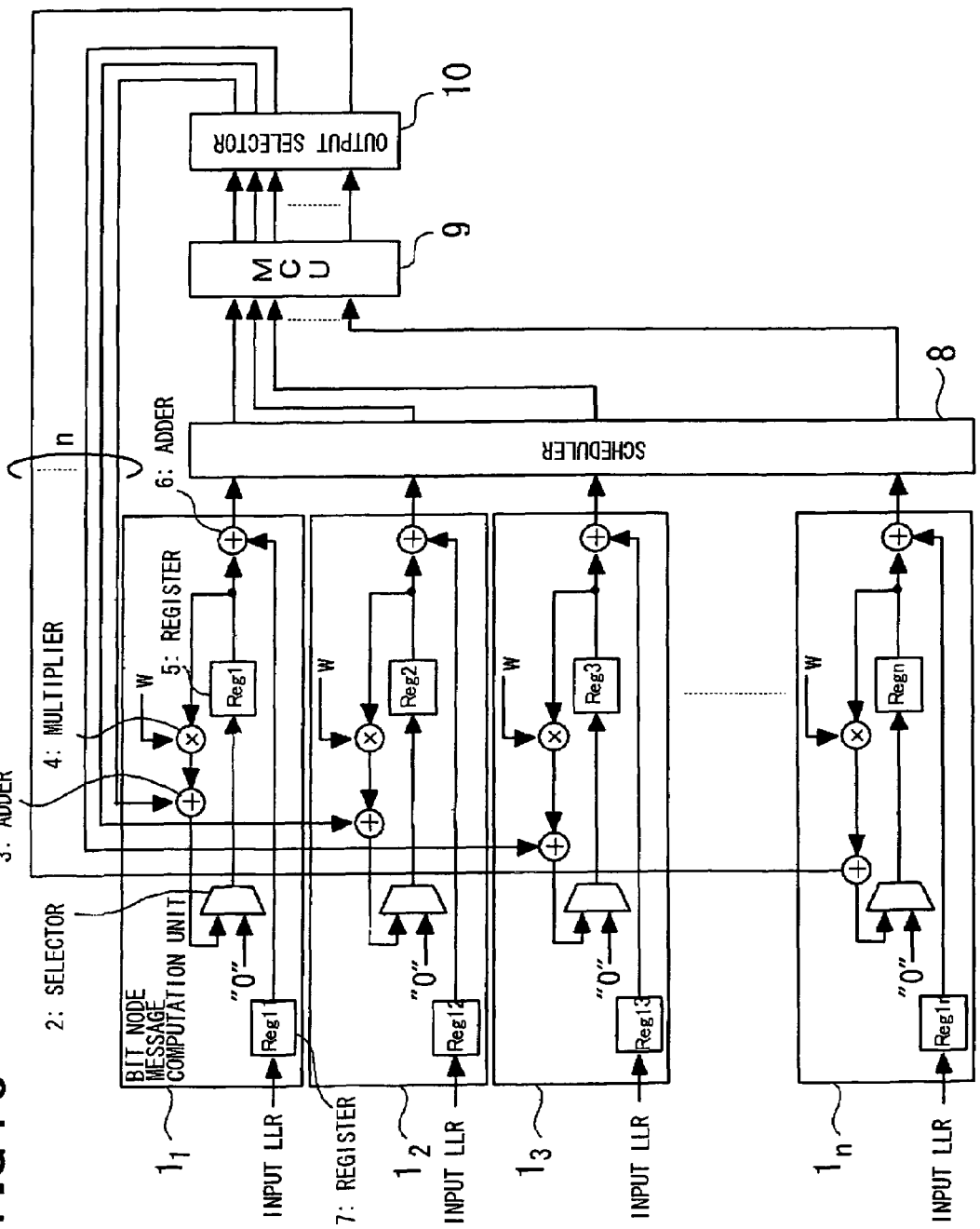
FIG. 3 is a diagram illustrating the structure of the embodiment of the present invention.
Figure 4:
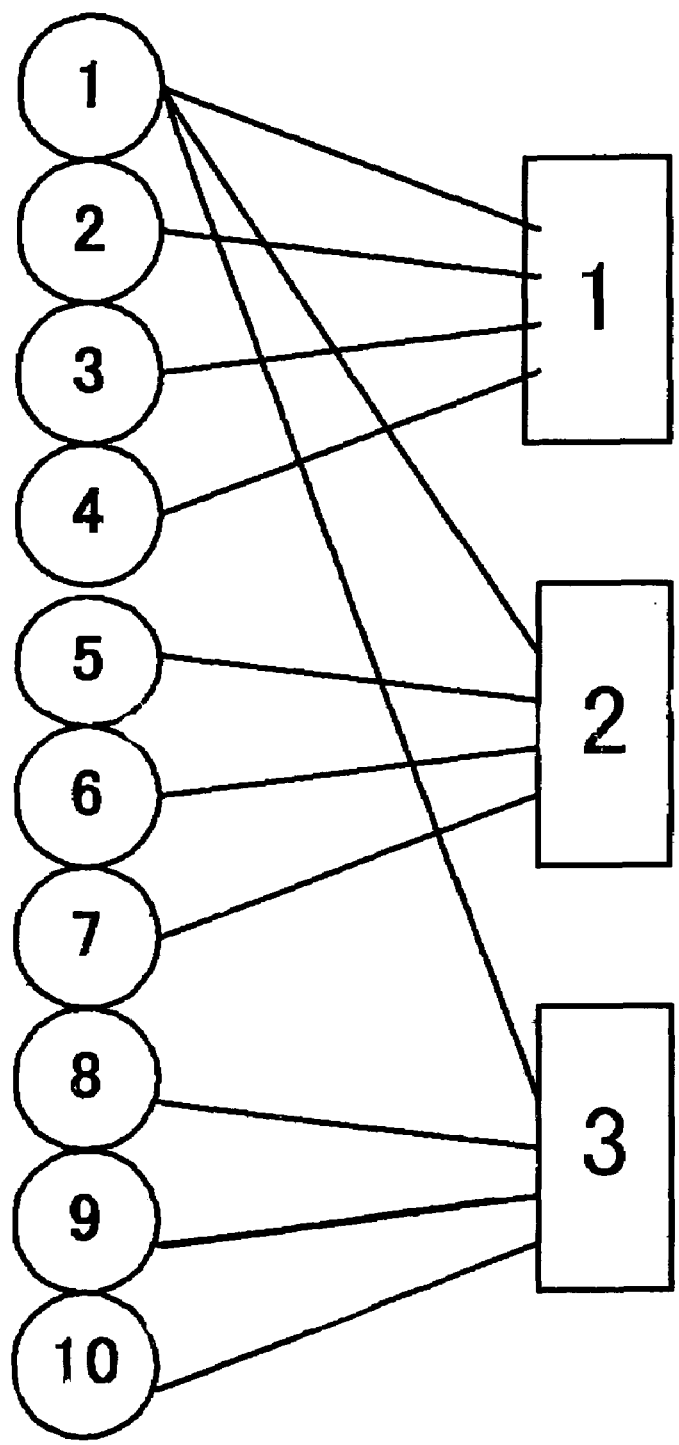
FIG. 4 is an example of a Turner graph.

FIG. 3 is a diagram illustrating the structure of a decoder circuit of the embodiment of the present invention. In FIG. 3, the circuit comprises n bit node message computation units $1_1$ to $1_n$, a scheduler 8, an MCU 9 (Message Computation Unit: also called "check node message computation unit"), and an output selector 10. The scheduler 8 selects a check node to which the bit node message computation units $1_1$ to $1_n$ output messages. The MCU9 is a controller that constitutes the check nodes. The output of the MCU9 is forwarded to a bit node message computation unit selected from the bit node message computation units $1_1$ to $1_n$ via the output selector 10. FIG. 3 shows a structure when the cluster size is 1.

The bit node message computation unit $1_1$ comprises a selector 2, an adder 3, a multiplier 4, a register 5, a register 7, and an adder 6. The register 7 holds the input LLR. The adder 6 adds the value of the register 5 (Reg1) and the input LLR (an output of the register 7). Note that all the n bit node message computation units $1_1$ to $1_n$ are structured identically.

The multiplier 4 multiplies the output of the register 5 (Reg1) by the weighted coefficient w. When a property (states quantity) $QS_n(k-1)$ at the time k-1 is stored in the register 5, the multiplier 4 outputs $QS_n(k-1)*w$ (refer to the equation (8)).

The adder 3 adds the output of the multiplier 4 ($QS_n(k-1)*w$) and the message $R_{m'n}$ from the MCU 9, derives the property $QS_n(k)$ at this time (the time k)—refer to the equation (8)—, and updates the register 5. Note that there is only one message that the MCU9 pays attention to and the bit node n receives since the cluster size is 1 in the present embodiment. Therefore, the adding operation of $\Sigma R_{m'n}$ (refer to the equation (8)) is not performed. When the cluster size is equal to or greater than 2, the adder 3 adds the addition result ($\Sigma R_{m'n}$) of multiple messages from the MCU 9 to the output of the multiplier 4 ($QS_n(k-1)*w$).

The adder 6 performs the addition LLR+$QS_n(k)$ and output the result as $Q'_n(k)$ (refer to the equation (7)).

The scheduler 8 functions as a switch for supplying messages from a bit node to all check nodes connected to the bit node. For instance, it selects a path for messages from the bit node to the check node in the message passing shown in FIG. 5.

The MCU 9 computes the message $R_{mn}$ based on the equation (3) and output it. The output selector 10 distributes the message(s) from the MCU 9 to the destination bit node.

Figure 5:
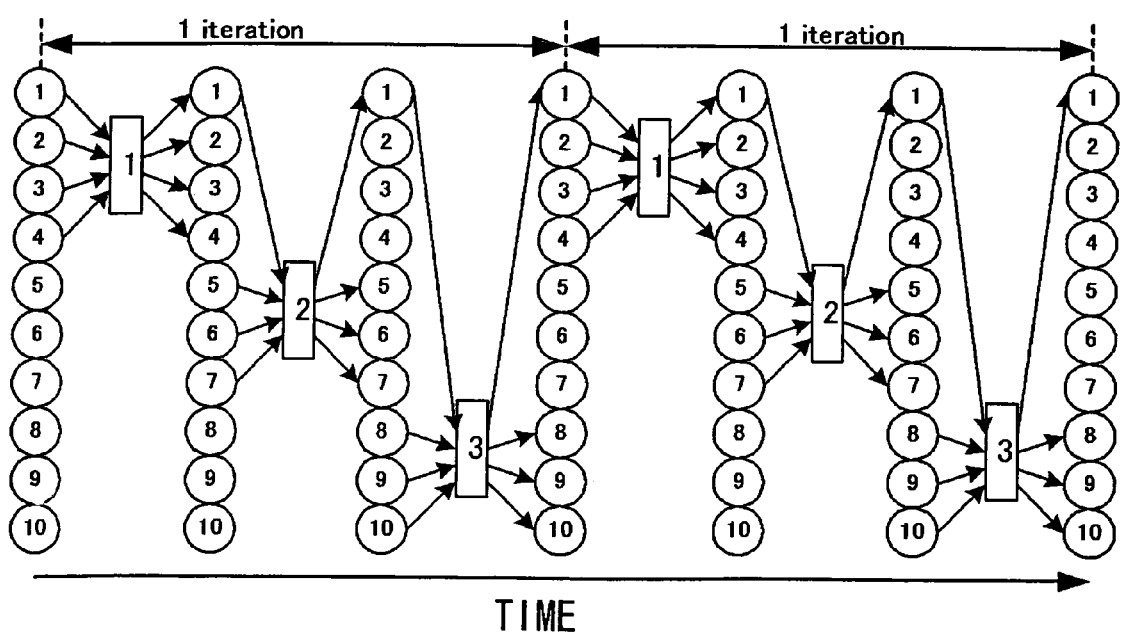
FIG. 5 is a drawing illustrating how messages are passed when the cluster size is 1.
Figure 6:
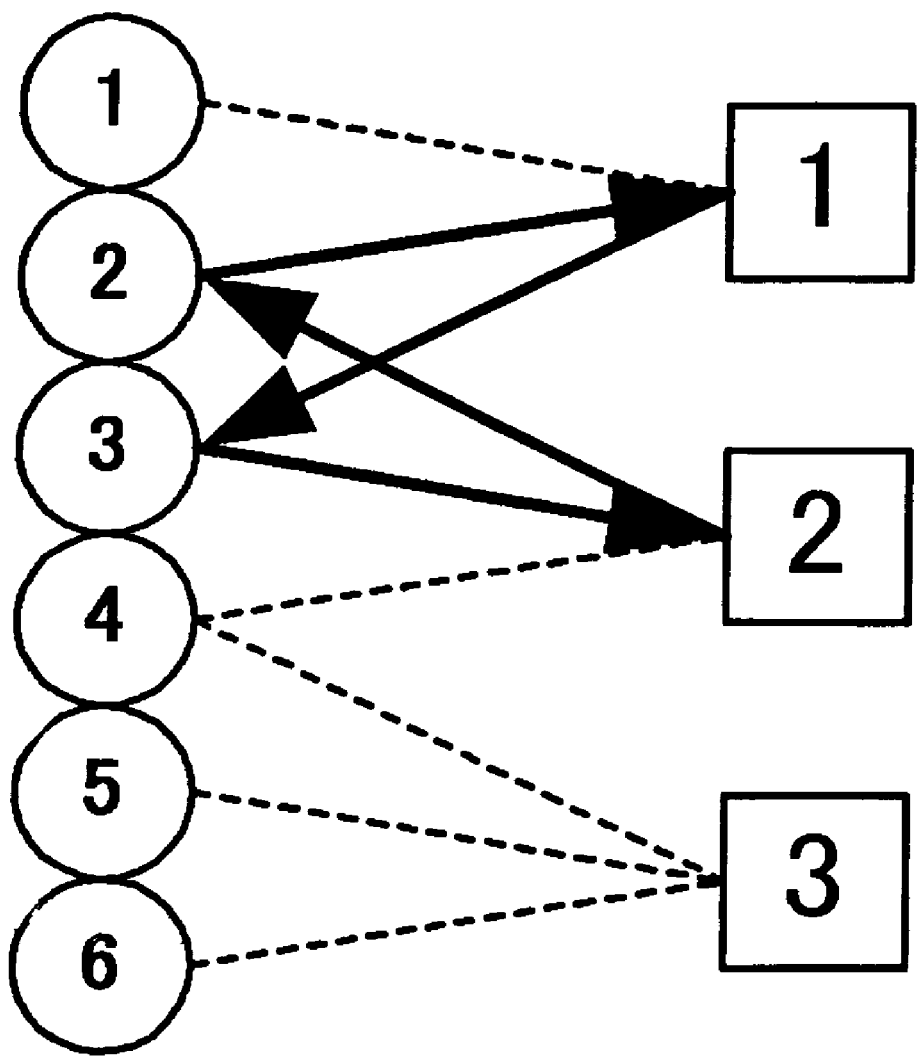
FIG. 6 is a Turner graph having a loop.
Figure 7A:
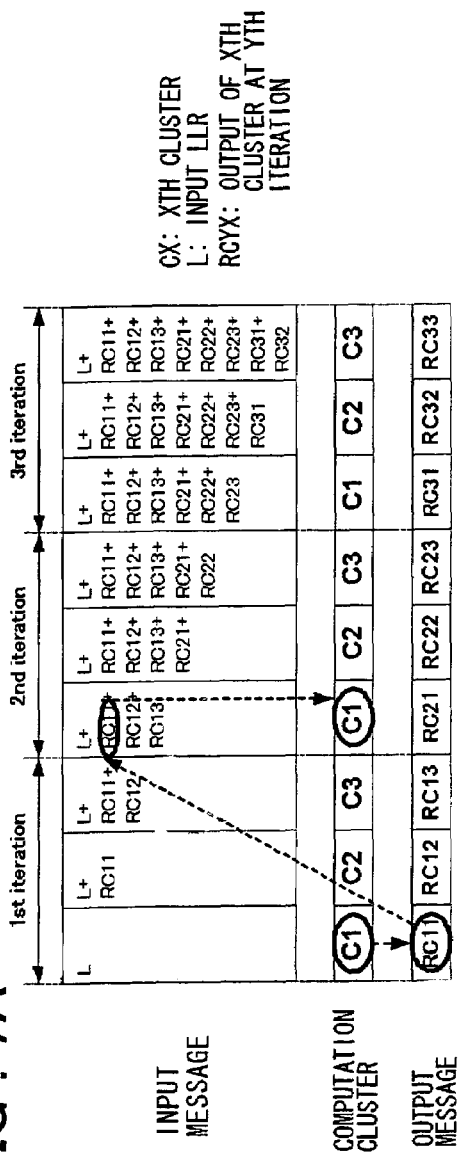
FIGS. 7A and 7B are timing charts time-sequentially showing messages passed between bit nodes and clusters.
Figure 7B:
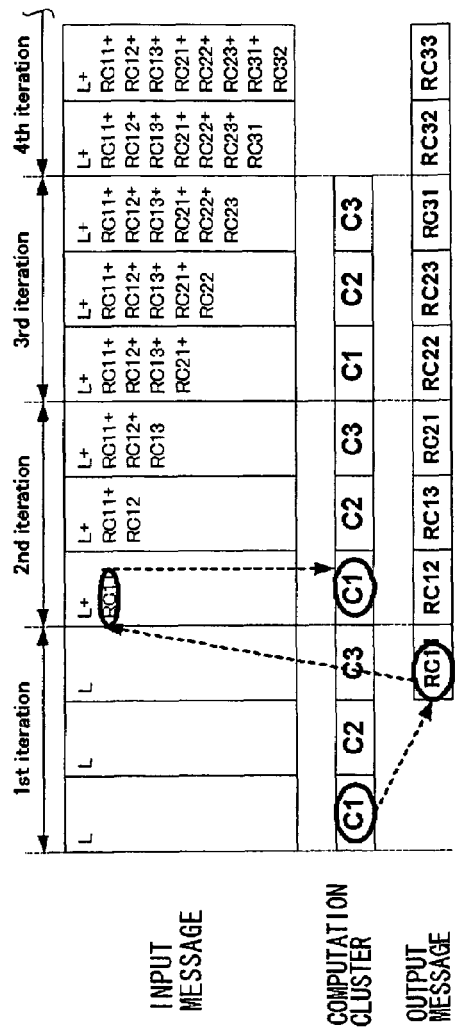

The output selector 10 selects a path for messages from the check node to the bit node(s), for instance, in the message passing shown in FIG. 5.

Referring to FIG. 2, a message outputted by the bit node message computation unit $1_1$ (the bit node 1) in the structure shown in FIG. 3 will be described. An input "0" of the selector 2 is an input for initializing the register 5 in the summing operation of the equation (8). When 0 is selected by the selector 2 and it is held by the register 5, the output of the adder 6 is L, which is the value of the input LLR, and a message L is supplied to a check node.

At this time, the output of the multiplier 4 is 0. The output of the adder 3 is RC11 when it receives the message RC11 sent by the cluster C1 (the check node 1). Since the selector 2 selects the output of the adder 3, RC11 is stored in the register 5, the adder 6 adds the value L of the input LLR to RC11, and a message L+RC11 is outputted to the check nodes.

Then, RC11*w, the result of multiplying RC11, the output of the register 5, by w by the multiplier 4, is added to a message RC12 from the cluster C2 (the check node 2). The result RC11*w+RC12 is selected by the selector 2 and held by the register 5. The adder 6 outputs a message L+RC11*w+RC12. The weight accumulation step is performed similarly, and the bit node 1 supplies L+RC11*$w^2$+RC12*w+RC13 to the check node 1 at the second iteration.

Note that the processings of the registers, the selector, the adders, and the multiplier of the bit node message unit shown in FIG. 3 may be realized by a program executed by a computer. The processings of the scheduler, the MCU, and the output selector may be performed by a computer program. This computer program is stored in a machine-readable medium, load into main memory and executed by a computer.

Even in the case where there is a delay in the message computation at the check nodes, when a message from a check node is supplied to the same check node, the ratio of this message can be similarly reduced by weighting the message.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A decoding device that decodes a received low density parity check code by repeating the passing of messages between a plurality of check nodes and a plurality of bit nodes corresponding to a low density parity check matrix, said decoding device comprising a weighting unit that weights at least one message sent from one of said check nodes to one of said bit nodes out of at least one message sent from said one of bit nodes to said one of check nodes.

2. The decoding device as defined in claim 1 comprising:
a controlling unit that controls a bit node to pass the same message or messages to all check nodes connected to said a bit node; wherein
said a bit node comprises a controlling unit that controls the ratio of a message or messages outputted by said one of check nodes within the entire messages sent to said one of check nodes to be smaller.

3. The decoding device as defined in claim 1 wherein the longer ago a message or messages are computed at said one of check nodes, the less influential said message or messages become.

4. The decoding device as defined in claim 1 wherein one of said bit nodes comprises:
a holding unit that holds a message or messages received from one of said check nodes, and a multiplier that multiplies said held message or messages by a weight of a positive number smaller than 1 every time said one of bit nodes receives message or messages from said one of check nodes thereafter followed by holding the multiplication result.

5. The decoding device as defined in claim 4 wherein upon receiving a message for the $i^{th}$ time, where i is a positive number not less than 2, from said check nodes, said bit nodes compute a message to be sent to one of said check nodes based on the multiplication of a message received from said one of said check nodes for the $j^{th}$ time, where j is an integer greater than or equal to 1, but less than i, by $w^{(i-j)}$, where w is the weighted coefficient, and said message received for the $i^{th}$ time, where i is a positive number not less than 2.

6. A decoding device that decodes a received low density parity check code by repeating the passing of messages between a plurality of check nodes and a plurality of bit nodes corresponding to a low density parity check matrix, said decoding device comprising:
means for controlling a bit node to pass the same message to all check nodes connected to said a bit node, and
means for controlling the ratio of a message or messages outputted by a check node the same as said check node within the entire messages sent to said check node to be reduced.

7. A decoding method comprising:
decoding a received low density parity check code by repeating the passing of messages between a plurality of check nodes and a plurality of bit nodes corresponding to a low density parity check matrix; and
weighting at least one message sent from one of said check nodes to one of said bit nodes out of at least one message sent from said one of bit nodes to said one of check nodes.

8. The decoding method as defined in claim 7 wherein the longer ago a message is computed at said one of check nodes, the less influential said at least one message becomes.

9. The decoding method as defined in claim 7 wherein said one of bit nodes holds at least one message received from said one of check nodes, multiply said held message by a weight of a positive number smaller than 1 every time said one of bit nodes receives at least one message from said one of check nodes thereafter, and holds the multiplication result.

10. The decoding method as defined in claim 9 wherein upon receiving a message or messages for the $i^{th}$ time, where i is a positive number not less than 2, from said one of check nodes, said one of bit nodes computes a message or messages to be sent to said one of check nodes based on the multiplication of a message or messages received from said one of check nodes for the $j^{th}$ time, where j is an integer greater than or equal to 1, but less than i, by $w^{(i-j)}$, where w is the weighted coefficient, and said message or messages received for the $i^{th}$ time, where i is a positive number not less than 2.

11. A computer-readable program stored in machine-readable medium, having a computer execute the following steps comprising:
decoding a received low density parity check code by repeating the passing of a message or messages between a plurality of check nodes and a plurality of bit nodes corresponding to a low density parity check matrix; and weighting a message or messages sent from one of said check nodes to one of said bit nodes out of a message or messages sent from said one of bit nodes to said one of check nodes.

12. The program stored in machine-readable medium as defined in claim 11 comprising:
controlling a bit node to pass the same message to all check nodes connected to said a bit node.

13. The program stored in machine-readable medium as defined in claim 11 wherein said program executes a step that the longer ago a message or messages are computed at said one of check nodes, the less influential said message or messages become.

14. The program stored in machine-readable medium as defined in claim 11 wherein said program comprises a step that said one of bit nodes holds a message or messages received from said one of check nodes, and a step multiplying said held message or messages by a weight of a positive number smaller than 1 every time said one of bit nodes receives message or messages from said one of check nodes thereafter, followed by holding the multiplication result.

15. The program stored in machine-readable medium as defined in claim 14 wherein said program comprises a step of computing a message or messages to be sent to said one of check nodes upon receiving a message or messages for the $i^{th}$ time, where i is a positive number not less than 2, from said one of check nodes based on the multiplication of a message or messages received from said one of check nodes for the $j^{th}$ time, where j is an integer greater than or equal to 1, but less than i, by $w^{(i-j)}$, where w is the weighted coefficient, and said message or messages received for the $i^{th}$ time, where i is a positive number not less than 2.

16. A decoding device that decodes a received low density parity check code by repeating the passing of messages between a plurality of check nodes and a plurality of bit nodes corresponding to a low density parity check matrix, said decoding device comprising a weighting unit that weights at least one message sent from one of said check nodes to one of said bit nodes out of at least one message sent from said one of bit nodes to said one of check nodes.

17. The decoding device as defined in claim 16 comprising:
a controlling unit that controls a bit node to pass the same message or messages to all check nodes connected to said a bit node; wherein
said a bit node comprises a controlling unit that controls the ratio of a message or messages outputted by said one of check nodes within the entire messages sent to said one of check nodes to be smaller.

18. The decoding device as defined in claim 16 wherein the longer ago a message or messages are computed at said one of check nodes, the less influential said message or messages become.

19. The decoding device as defined in claim 16 wherein one of said bit nodes comprises:
a holding unit that holds a message or messages received from one of said check nodes, and a multiplier that multiplies said held message or messages by a weight of a positive number smaller than 1 every time said one of bit nodes receives message or messages from said one of check nodes thereafter followed by holding the multiplication result.

20. The decoding device as defined in claim 19 wherein upon receiving a message for the $i^{th}$ time, where i is a positive number not less than 2, from said check nodes, said bit nodes compute a message to be sent to one of said check nodes based on the multiplication of a message received from said one of check nodes for the $j^{th}$ time, where j is an integer greater than or equal to 1, but less than i) by $w^{(i-j)}$, where w is the weighted coefficient, and said message received for the $i^{th}$ time, where i is a positive number not less than 2.

* * * * *